US007408399B2

(12) United States Patent
Salato et al.

(10) Patent No.: US 7,408,399 B2
(45) Date of Patent: Aug. 5, 2008

(54) ACTIVE DRIVING OF NORMALLY ON, NORMALLY OFF CASCODED CONFIGURATION DEVICES THROUGH ASYMMETRICAL CMOS

(75) Inventors: Maurizio Salato, El Segundo, CA (US); Marco Soldano, El Segundo, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 11/439,459

(22) Filed: May 23, 2006

(65) Prior Publication Data

US 2006/0290407 A1 Dec. 28, 2006

Related U.S. Application Data

(60) Provisional application No. 60/694,330, filed on Jun. 27, 2005.

(51) Int. Cl.
*H03K 17/687* (2006.01)
*H03K 19/0175* (2006.01)

(52) U.S. Cl. ....................... 327/427; 327/429; 327/574; 327/567; 327/108; 326/82

(58) Field of Classification Search ................. 327/427, 327/429, 108, 109; 323/225; 326/25, 17, 326/119; 257/225, 192
See application file for complete search history.

(56) References Cited

U.S. PATENT DOCUMENTS 4,798,978 A * 1/1989 Lee et al. ...................... 326/25
5,387,880 A * 2/1995 Kobayashi .................. 330/296
5,719,520 A * 2/1998 Au et al. ..................... 327/427
6,741,099 B1 * 5/2004 Krugly ........................ 326/82
7,339,206 B2 * 3/2008 Akamatsu et al. ........... 257/192
2005/0051808 A1 * 3/2005 Hynecek ..................... 257/225

* cited by examiner

*Primary Examiner*—Quan Tra
*Assistant Examiner*—Colleen O'Toole
(74) *Attorney, Agent, or Firm*—Ostrolenk, Faber, Gerb & Soffen, LLP

(57) ABSTRACT

Disclosed is a method of controlling a High Electron Mobility Transistor (HEMT) through a cascode circuit, the cascode circuit including first and second switches, a capacitor connected to a source of the first switch, a source of the HEMT being connected to the drain of the first switch, and a controller for controlling the first and second switches. The method is achieved by defining state A, where the first switch is controlled to be OFF resulting in the HEMT being OFF and the second switch is controlled to be ON allowing the capacitor to be charged and stabilizing the drain voltage of the HEMT at around the HEMT gate threshold voltage. The method further defines state B, where the first switch is controlled to be ON resulting in the HEMT being ON and the second switch is controlled to be OFF almost all the time, thereby preserving the charge stored in the capacitor. Moreover, the method provides transitioning from state A to state B to turn the HEMT ON; and transitioning from state B to state A to turn the HEMT OFF, wherein the first switch is switched-OFF and the second switch is switched-ON allowing for quicker charge of the output capacitance of the first switch from the capacitor to keep the HEMT OFF.

18 Claims, 2 Drawing Sheets

10
D
Vcc
S1
G1
12
Depl. Mode, norm. on dev.
S
G
G2
M2 (P-Ch)
D
Driver or controller IC
D
C
M1 casc. Driver (N-ch)
G
S
S

ACTIVE DRIVING OF NORMALLY ON, NORMALLY OFF CASCODED CONFIGURATION DEVICES THROUGH ASYMMETRICAL CMOS

CROSS-REFERENCE TO RELATED APPLICATION

This application is based on and claims benefit of U.S. Provisional Application Ser. No. 60/694,330, filed on Jun. 27, 2005, entitled ACTIVE DRIVING OF NORMALLY ON, NORMALLY OFF CASCODED CONFIGURATION DEVICES THROUGH ASYMMETRICAL CMOS, to which a claim of priority is hereby made and the disclosure of which is incorporated by reference.

BACKGROUND OF THE INVENTION

The present invention relates to a cascode switching structure and, more particularly to using a low voltage P-channel MOSFET whose source is connected to a capacitor and its drain to a drain of a driver switch.

A cascode circuit is a technique for improving a performance of an analog circuit. It provides a very useful two-transistor configuration formed of a common source stage followed by a common gate stage. The cascode combines the two amplifier stages for increased output resistance and reduced parasitic capacitance, resulting in a high gain with increased bandwidth. The cascode provides better high-frequency performance and higher output resistance.

The cascoded configuration of a normally ON depletion mode and a normally OFF semiconductor devices allows reliable and safe operation in switching mode power supply systems.

Simple coupling of those two parts rely upon their own parameters for dynamic behavior, especially during a switch-OFF. The proposed arrangement enhances the switch-OFF transient, making use of the charge stored in $V_{CC}$ supply capacitor.

SUMMARY OF THE INVENTION

It is an object of the present invention to avoid a loss of a diode drop when a rectifier is used.

It is another object of the present invention to force a switch-OFF transition to be faster.

Other features and advantages of the present invention will become apparent from the following description of the invention that refers to the accompanying drawings.

Disclosed is a method of controlling a High Electron Mobility Transistor (HEMT) through a cascode circuit, the cascode circuit including first and second switches, a capacitor connected to a source of the first switch, a source of the HEMT being connected to both the drains of the first and second switches, and a controller for controlling the first and second switches. The method is achieved by defining state A, where the first switch is controlled to be OFF resulting in the HEMT being OFF and the second switch is controlled to be ON allowing the capacitor to be charged and stabilizing the drain voltage of the P- and N-channel switches at around the HEMT gate threshold voltage. The method further defines state B, where the first switch is controlled to be ON resulting in the HEMT being ON and the second switch is controlled to be OFF almost all the time, thereby preserving the charge stored in the capacitor. Moreover, the method provides transitioning from state A to state B to turn the HEMT ON; and transitioning from state B to state A to turn the HEMT OFF, wherein the first switch is switched-OFF and the second switch is switched-ON allowing for quicker charge of the output capacitance of the first switch from the capacitor to keep the HEMT OFF.

The present invention avoids loses from the diode drop by charging a capacitance C through a channel with a resistive behavior. Additionally, the switch-OFF transition is forced to be faster by balancing a charge between the $V_{CC}$ capacitor and a cascoded driver switch output capacitance

DETAILED DESCRIPTION OF EMBODIMENTS OF THE INVENTION

Figure 1:
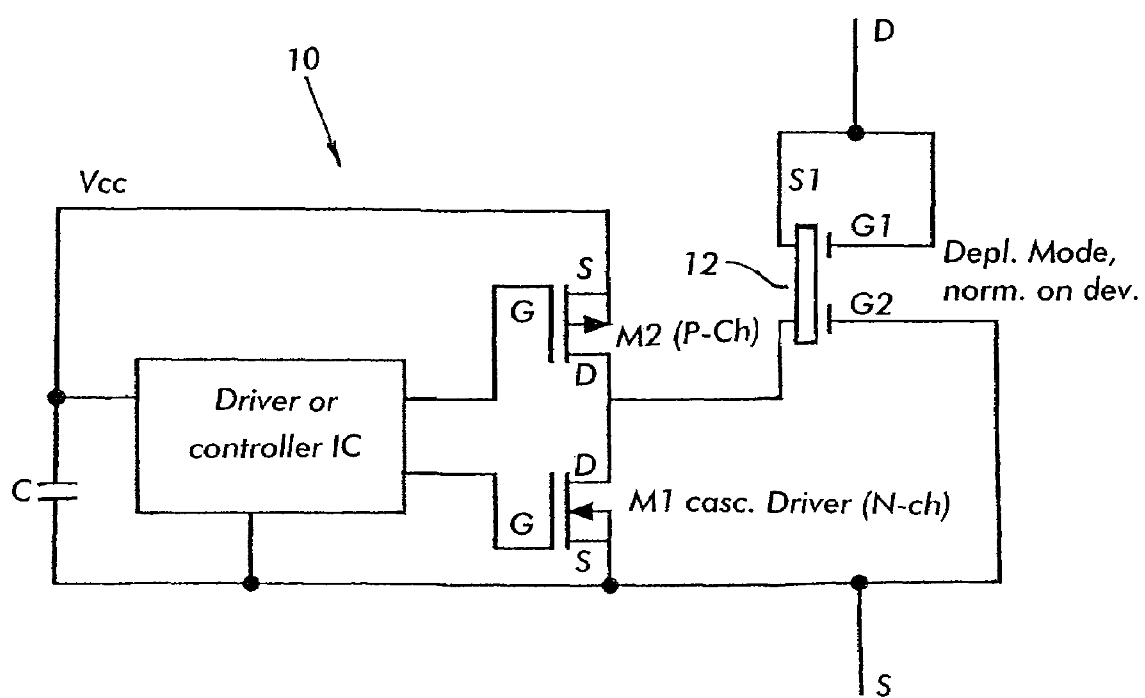
FIG. 1 is a diagram of a circuit utilizing the cascode circuit of the preferred embodiment of the present invention.

FIG. 1 illustrates a circuit 10 of the preferred embodiment of the present invention. The circuit 10 includes a low voltage P-channel Metal-Oxide Semiconductor Field-Effect Transistor (MOSFET) or switch M2. The P-channel MOSFET may be obtained by doping a semiconductor to increase the number of free positive charge carriers. In circuit 10, the source of the P-channel switch M2 is connected to a $V_{CC}$ capacitor C and the drain of the switch M2 is connected to a source S2 of a High Electron Mobility Transistor (HEMT) 12. This transistor 12 is being driven by a driver integrated circuit (IC) 14 through Ml cascoded transistor driver. HEMT 12 is a depletion mode normally on device and may be based on GaN technology. In order for it to turn off, one of the two gates (G2 in FIG. 1, but Gl might also apply) has to be kept at the lowest possible potential with respect to the remaining three devices' pins and below a threshold voltage with respect to its source pin.

The circuit 10 further illustrates a complementary metal-oxide semiconductor (CMOS) structure formed by the P-channel switch M2 and an N-channel switch M1. The structure is controlled by the controller IC 14. The switch M1 carries all the HEMT current, while the switch M2 manages a current flow between the capacitor C and Coss of the switch M1. A gate of the switch M2 is controlled so as to maximize the advantage of the described CMOS structure.

The inventive CMOS structure operates in accordance with the following states and transitions. In state A, the cascoded switch M1 is controlled to be OFF, as a result, in accordance with the cascode structure, the HEMT is kept OFF. The switch M2 is controlled to be ON allowing the capacitor C to be charged from S2. S2 is stabilized at around the HEMT gate threshold voltage. In state A, the switch M2 acts as a synchronous rectifier, allowing a lower voltage drop then a diode and a faster supply capacitor charge.

In state B, the cascoded switch M1 is controlled to be ON resulting in the HEMT also to be fully ON. The switch M2 is controlled to be OFF, thereby preserving the charge stored in the $V_{CC}$ supply capacitor C. In state B, the controller IC 14 manages to switch the cascoded switch M1 almost fully ON.

When the circuit 10 transitions from state A to state B, the cascoded switch M1 is being switched-ON while the switch M2 is being switched-OFF. In accordance with CMOS structure of the present invention, the switch M2 switches-OFF before the cascoded switch M1 switches-ON. This is shown by the dead-time in FIG. 2.

Figure 2:
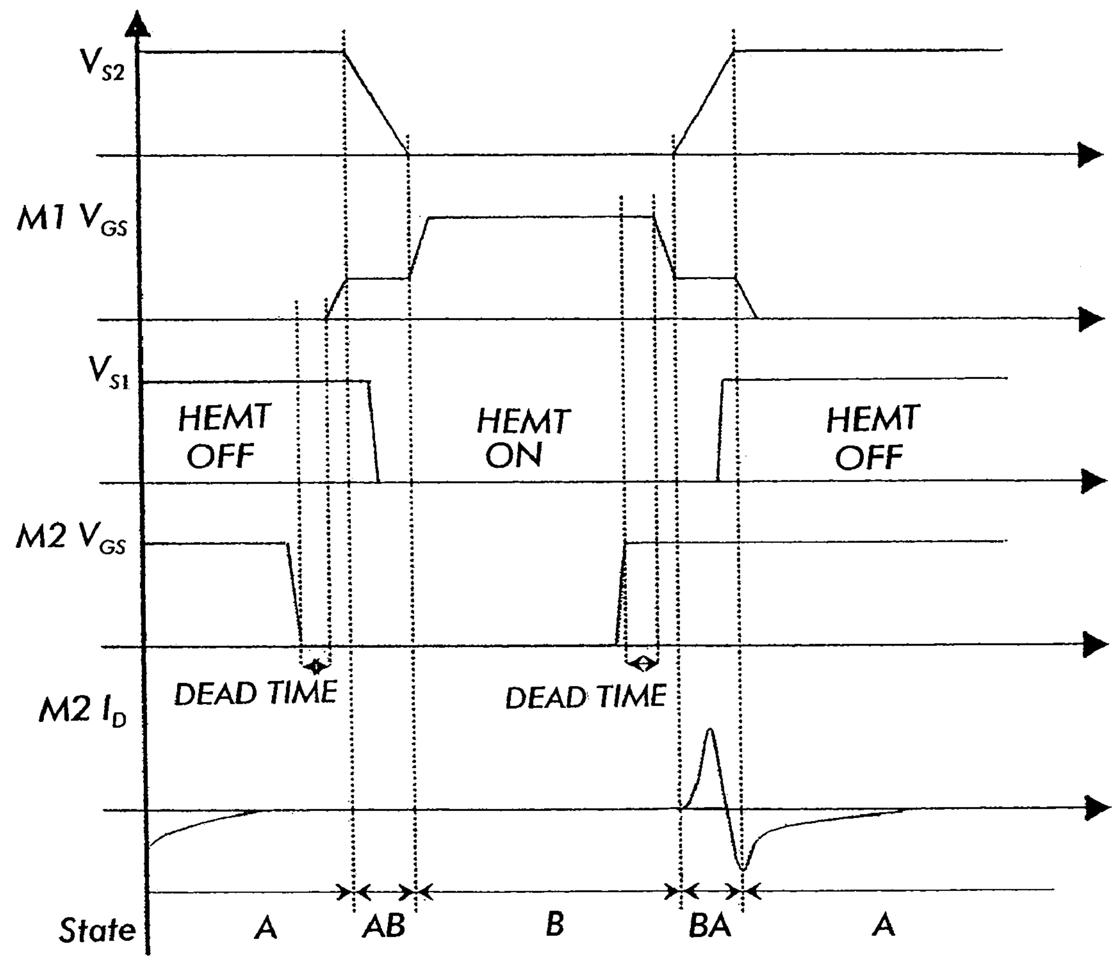
FIG. 2 is a graph illustrating the effect of state transitions of the cascode circuit on the various voltages and a current.

When the circuit 10 transitions from state B to state A, the cascoded switch M1 is being switched-OFF while the switch M2 is being switched-ON. In this transition the benefit of the CMOS structure is even more evident. In particular, as shown in FIG. 2, the effect of the drain to source voltage $V_{DS}$ of the cascoded switch M1 produces the following effect:

Before the $V_{DS}$ voltage of M1 ($V_{S2}$) reaches the HEMT threshold voltage, the HEMT is still fully ON, thus the transition is dominated by the cascoded switch M1;

As soon as the $V_{DS}$ voltage reaches the HEMT threshold voltage, the HEMT switch 12, which may be a GaN transistor, starts to switch-OFF, thereby reducing the current flow.

The output capacitance of the cascoded switch M1 would be charged by this residual load or even only a leakage current from the HEMT.

The switch M2 is then switched-ON, allowing for quicker charge of the Coss of the cascoded switch M1 from the $V_{CC}$ of the capacitor C. This effect is similar to adding an already charged and bigger capacitor (C) in parallel to the output capacitance of the cascoded switch M1.

This allows a faster establishment of steady voltage on S2, keeping the HEMT 12 OFF. During OFF time, the capacitor C is charged to the maximum voltage reached by S2, which is usually higher than the HEMT threshold.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A cascode circuit having source and drain terminals for driving a High Electron Mobility Transistor (HEMT) having first and second source terminals and first and second gate terminals, the first source and gate terminals of the HEMT being connected to the drain of the cascode circuit and the second gate terminal of the HEMT being connected to the source of the cascode circuit, the circuit comprising:

- first and second switches, each having source, drain and gate terminals, the first and second switches being connected at their drain terminals;
- a capacitor connected between the source terminals of the first and second switches;
- the HEMT having the second source terminal connected to the drain terminals of the first and second switches; and
- a controller for controlling the first and second switches being connected to the gate terminals of the first and second switches.

2. The circuit of claim 1, wherein the second switch is a P-channel switch comprising a low voltage Metal-Oxide Semiconductor Field-Effect Transistor (MOSFET).

3. The circuit of claim 2, wherein the first switch comprises an N-channel switch, wherein the N-channel and P-channel switches together form a complementary metal-oxide semiconductor (CMOS) structure controlled by the controller.

4. The circuit of claim 3, wherein the N-channel switch carries substantially all the current through the HEMT and the P-channel switch directs current flow between the capacitor and the N-channel switch.

5. The circuit of claim 3, wherein the structure operates in accordance with states A and B and transitions from the state A to state B and from state B to state A.

6. The circuit of claim 5, wherein in the state A the N-channel switch is controlled to be OFF resulting in the HEMT being OFF and the P-channel switch is controlled to be ON, which

- allows the capacitor to be charged, and
- stabilizes the drain voltage of the P- and N-channel switches at around the HEMT gate threshold voltage.

7. The circuit of claim 6, wherein the P-channel switch acts as a synchronous rectifier, allowing a lower voltage drop than a diode and faster charging of the capacitor.

8. The circuit of claim 5, wherein in state B the N-channel switch is controlled to be ON resulting in the HEMT being ON and the P-channel switch is controlled to be OFF almost all the time, thereby preserving the charge stored in the capacitor.

9. The circuit of claim 5, wherein during the transition from state A to state B the N-channel switch is switched-ON after the P-channel switch is switched-OFF.

10. The circuit of claim 5, wherein during the transition from state B to state A the N-channel switch is switched-OFF and the P-channel switch is switched-ON allowing for quicker charge of an output capacitance of the N-channel switch from the capacitor thereby keeping the HEMT OFF.

11. The circuit of claim 10, further comprising the effect of the drain to source voltage $V_{DS}$ of the N-channel switch, wherein

- before the $V_{DS}$ voltage reaches a HEMT threshold voltage, the HEMT is fully ON,
- when the $V_{DS}$ voltage reaches the HEMT threshold voltage, the HEMT starts to switch-OFF, thereby reducing current flow in the HEMT, and
- the output capacitance of the N-channel switch is charged by any residual load or leakage current from the HEMT.

12. A method of controlling a High Electron Mobility Transistor (HEMT) having first and second gate and source terminals through a cascode circuit, the cascode circuit including first and second switches each having gate, source, and drain terminals, a capacitor connected between the source terminals of the first and second switch, the first source terminal of the HEMT being connected to the drain terminals of the controlling switches, and a controller for controlling the first and second switches, the method comprising the following steps:

- defining state A, where the first switch is controlled to be OFF resulting in the HEMT being OFF and the second switch is controlled to be ON allowing the capacitor to be charged and stabilizing the drain voltage of the first and second switches at around the HEMT gate threshold voltage;
- defining state B, where the first switch is controlled to be ON resulting in the HEMT being ON and the second switch is controlled to be OFF almost all the time, thereby preserving the charge stored in the capacitor;
- transitioning from state A to state B to turn the HEMT ON; and
- transitioning from state B to state A to turn the HEMT OFF, wherein the first switch is switched-OFF and the second switch is switched-ON allowing for quicker charge of the output capacitance of the first switch from the capacitor to keep the HEMT OFF.

13. The circuit of claim 12, wherein the first switch is a low voltage N-channel Metal-Oxide Semiconductor Field-Effect Transistor (MOSFET).

14. The circuit of claim 13, wherein the second switch acts as a synchronous rectifier, allowing a lower voltage drop than a diode and a faster supply capacitor charge.

15. The circuit of claim 13, wherein during the transition from state A to state B the first switch is switched-ON after the second switch is switched-OFF.

16. The circuit of claim 13, transitioning from state B to state A comprises the effect of the drain to source voltage $V_{DS}$ of the first switch, wherein

- before the $V_{DS}$ voltage reaches a HEMT threshold voltage the HEMT is fully ON, when the $V_{DS}$ voltage reaches the HEMT threshold voltage the HEMT starts to switch-OFF, thereby reducing current flow through the HEMT, and the output capacitance of the N-channel switch is charged by any residual load or leakage current from the HEMT.

17. A cascode circuit for driving a High Electron Mobility Transistor (HEMT) having first and second source terminals and first and second gate terminals, the first source and the first gate terminals being connected to a HEMT drain and the second gate terminal being connected to a HEMT source, the circuit comprising:

a switching stage including high and low switches each having source, drain, and gate terminals, the drain terminals of the high and low switches being connected at a switching node and to the second source terminal;

a capacitor connected between the source terminals of the high and low switches; and a controller for controlling the switching stage, wherein the high switch is acts as a synchronous rectifier, allowing a lower voltage drop than a diode and faster charging of the capacitor.

18. The circuit of claim 17, wherein the low switch is N-channel and carries substantially all the current through the HEMT and the high switch is P-channel and directs current flow between the capacitor and the low switch.

* * * * *